United States Patent [19]
Huang

[11] Patent Number: 6,165,000
[45] Date of Patent: Dec. 26, 2000

[54] ZIF SOCKET WITH REINFORCEMENT DRIVING MECHANISM

[75] Inventor: Yao-Chi Huang, Yung-Ho, Taiwan

[73] Assignee: Hon Hai Precision Ind. Co., Ltd., Taipei Hsien, Taiwan

[21] Appl. No.: 09/295,480

[22] Filed: Apr. 19, 1999

[51] Int. Cl.[7] .................................................. H01R 4/50
[52] U.S. Cl. ............................................................ 439/342
[58] Field of Search .................................. 439/342, 259, 439/263, 264, 268

[56] References Cited

U.S. PATENT DOCUMENTS

4,420,205  12/1983  Kirkman .
5,730,615   3/1998  Lai et al. ................................. 439/342

*Primary Examiner*—Khiem Nguyen
*Attorney, Agent, or Firm*—Wei Te Chung

[57] ABSTRACT

An electrical socket comprises a rectangular base having two wings extending from opposite corners thereof thereby defining a virtual diagonal line between the wings. A block extends upward from each wing of the base. A rectangular cover is movably engaged with the base and movable along the diagonal line of the base. A pair of opposite chamfered corners are formed on the cover. A closure block extend upward from four edges of the cover thereby thickening the chamfered corners. An operational cavity is defined between the thickened chamfered corner of the cover and the block of the base for position of an external screwdriver.

12 Claims, 8 Drawing Sheets

ZIF SOCKET WITH REINFORCEMENT DRIVING MECHANISM

BACKGROUND OF THE INVENTION

1. Field of The Invention

The present invention relates to a zero insertion force socket having a cover movable with respect to a base thereof, particularly one which has a reinforcement driving mechanism ready for an external tool to move the cover with respect to the base easily.

2. The Prior Art

Figure 7:
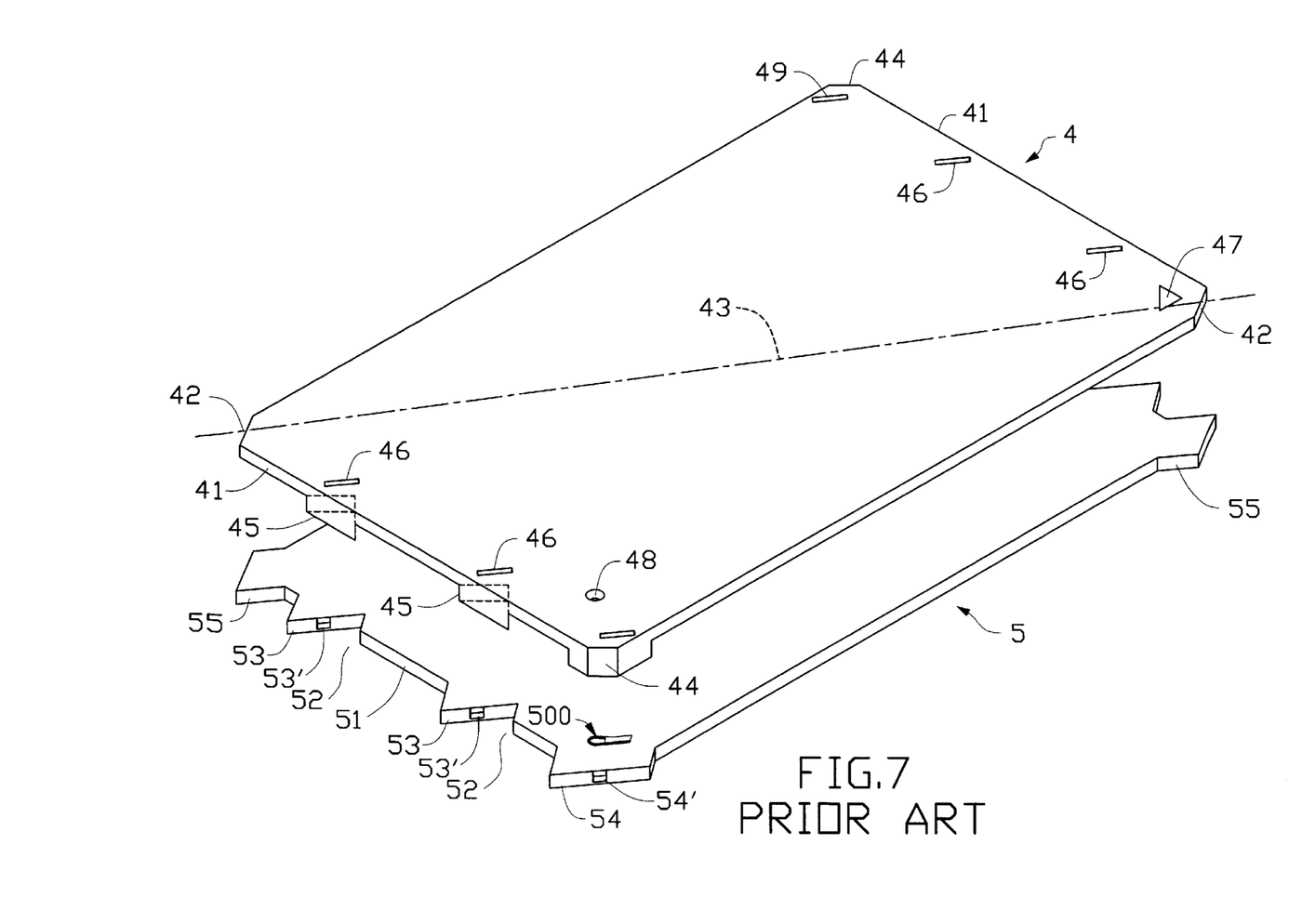
FIG. 7 is an exploded view of a conventional low profile socket.
Figure 8:
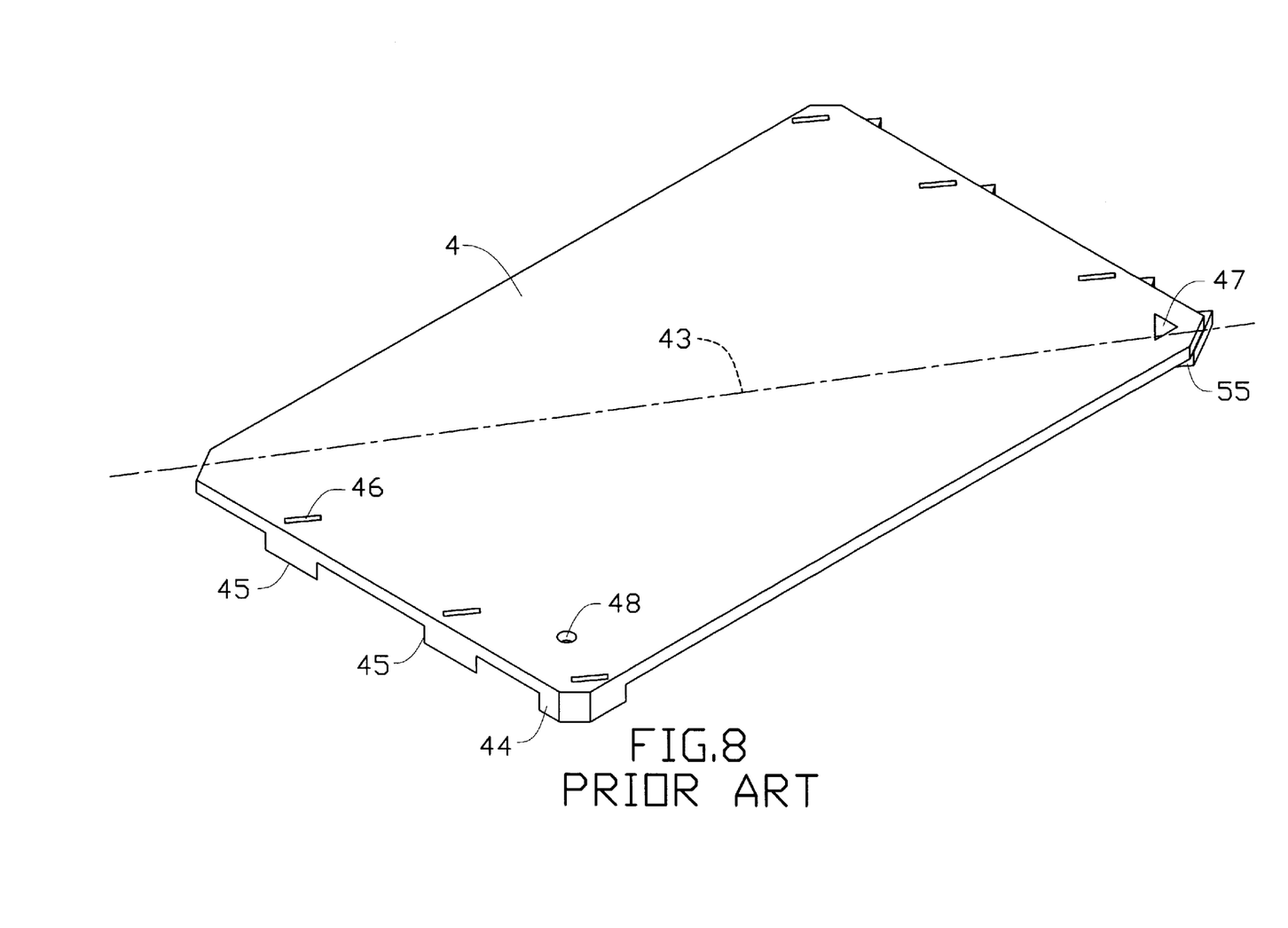
FIG. 8 is an assembled view of FIG. 7.

Zero insertion force (ZIF) sockets are used to connect a CPU to a printed circuit board for years. Normally, this socket needs a relatively long pitch for accommodating a lead-in distance of each contact which allows a corresponding CPU pin to be inserted into the socket with substantially zero insertion force firstly and then moved by a cover of the socket for this lead-in distance to abut against contacting portion of the contact in the socket. These sockets may be referred to U.S. Pat. Nos. 5,489,217 and 5,730,615. For effectively utilizing the space of the socket and lowering the profile thereof a low profile socket has been applied in U.S. application Ser. No. 09/146,998 which is Assigned to the same assignee of the present invention. Referring to FIGS. 7 and 8, the U.S. application Ser. No. 09/146,998 relates to a low profile socket comprising a rectangular cover 4 movably engaged with a rectangular base 5. The cover 4 has opposite sides 41 each of which has two triangular protrusions 45 extending downward and each triangular protrusion 45 forms a blind hole 46 at one wall thereof thereby exposing to an upper surface of the cover 4. The cover 4 has opposite chamfered corners 42 and a virtual diagonal line 43 is defined between the opposite corners 42. A triangular groove 47 is defined substantially along the diagonal line 43 for indicating the movement direction of the cover 4 with respect to the base 5. Two guiding protrusions 44 extend downward from another two opposite corners and each guiding protrusion 44 also defines a blind hole 46 at one wall thereof exposing to the surface of the cover 4. The base 5 has a similar shape and size to the cover 4 in order to mate with the cover 4 when assembled therewith as shown in FIG. 8. The base 5 has two opposite sides 51 each of which has two triangular cutouts 52 for movably receiving the triangular protrusions 45 of the cover 4. Each cutout 52 is defined between two interconnected inner walls and one of the inner walls parallel to a diagonal line (not shown) of the base 5 is called a guiding inner wall 53 which is also parallel to the diagonal line 43 of the cover 4. A tab 53' extends from each guiding inner wall 53 and is slidably received in the blind hole 46 of the triangular protrusion 45 of the cover 4 when the cover 4 is assembled to the base 5. Similarly, the base 5 has another two guiding walls 54 formed in a pair of opposite corners thereof each having a tab 54' projecting therefrom and slidably received in the blind hole 49 defined in the guiding protrusion 44 of the cover 4. The base 5 has two wings 55 extending from another pair of corners and substantially in alignment with the opposite corners 42 of the cover 4 when the cover 4 is assembled to the base 5. The cover 4 defines a plurality of conic holes 48 (only one is shown for simplicity) for receiving corresponding CPU pins (not shown). The base defines corresponding number of passageways 500 (only one is shown for simplicity) each of which is in alignment with a corresponding conic hole 48 and retains a contact (not shown) therein for electrically receiving the CPU pin therein. With this structure, the cover 4 may be moved by a screw driver or the like with respect to the base 5 along the diagonal line 43 thereof.

Although U.S. application Ser. No. 09/146,998 can provide a very low profile socket, the driving mechanism thereof is not satisfactory because an external tool such as a screwdriver when used to drive the cover to move with respect to the base, is apt to slip away out of an operational region defined between a corner of the cover and a vertical wall of an external frame which surrounds the socket. Moreover, the screwdriver is apt to damage the contacting portion (the corner) of the cover or cause warpage of the cover because the cover is too thin to be impacted by the screwdriver. It is requisite to provide a reinforced structure of the socket which can receive impact from a screwdriver without damaging the cover thereof.

SUMMARY OF THE INVENTION

The primary purpose of the present invention is to provide an improved low profile socket having a cover and a base and a reinforced driving mechanism for cooperating with an external tool to move the cover with respect to the base without damaging the cover when the cover is subject to considerable force from the external tool.

In accordance with one aspect of the present invention, an electrical socket comprises a rectangular base having two wings extending from opposite corners thereof thereby defining a virtual diagonal line between the wings. A block extends upward from each wing of the base. A rectangular cover is movably engaged with the base and movable along the diagonal line of the base. A pair of opposite chamfered corners are formed on the cover. A closure block extend upward from four edges of the cover thereby thickening the chamfered corners. An operational cavity is defined between the thickened chamfered corner of the cover and the block of the base for position of an external screwdriver.

DETAILED DESCRIPTION OF THE PREFERRED EMBODIMENT

Figure 1:
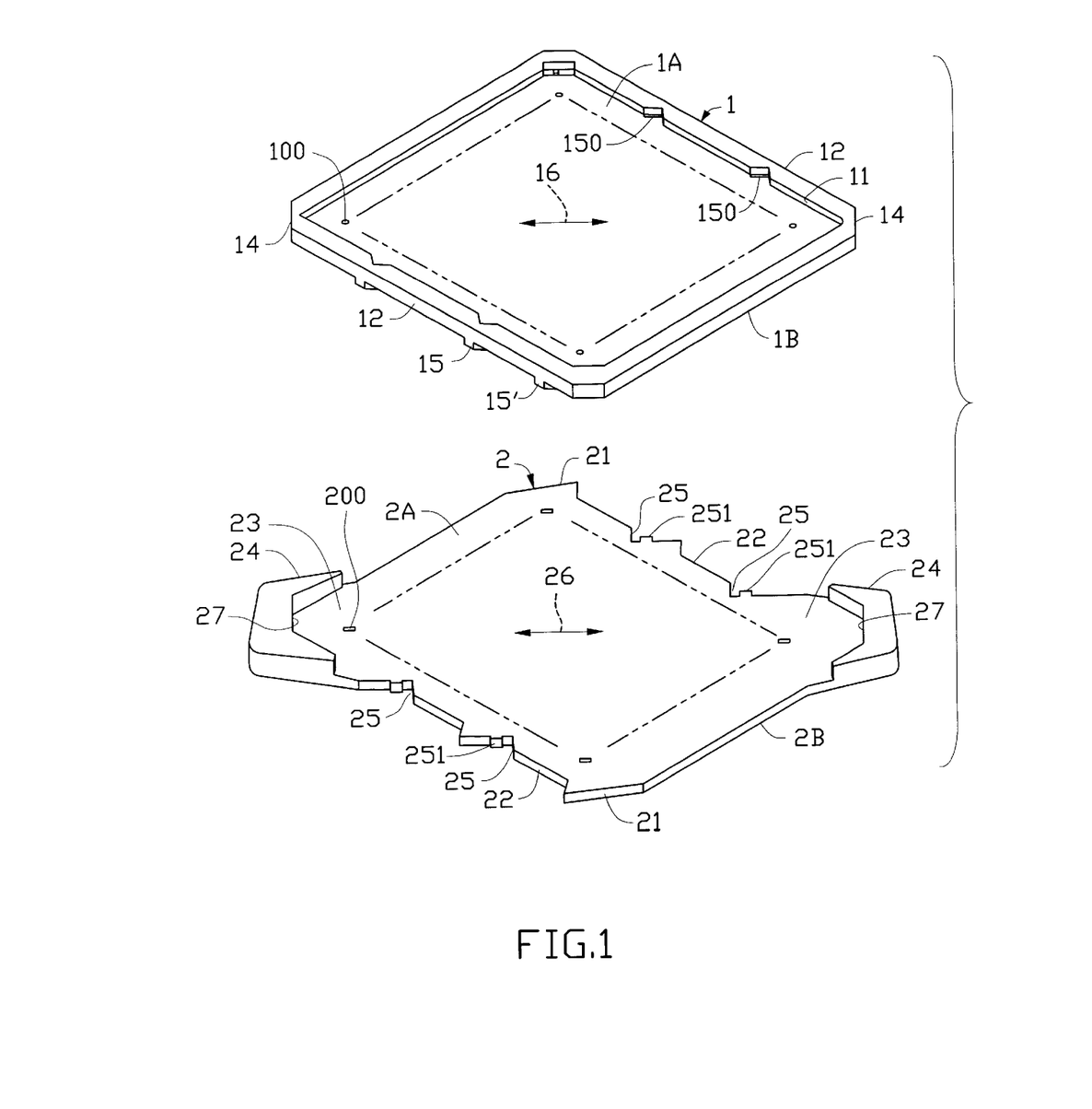
FIG. 1 is an exploded view of a low profile socket in accordance with the present invention.
Figure 2:
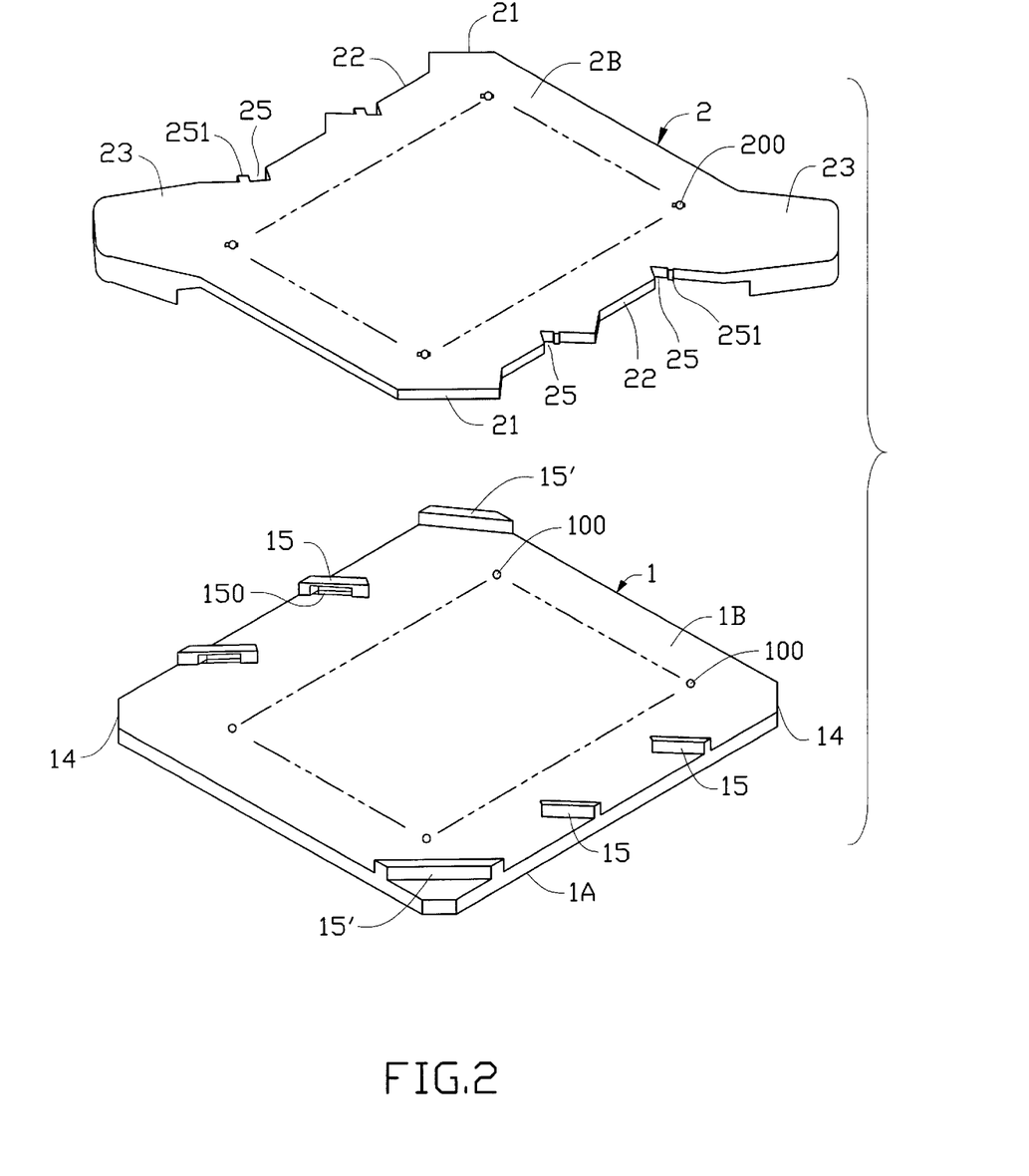
FIG. 2 is another exploded view of the low profile socket of FIG. 1 taken from opposite direction.
Figure 3:
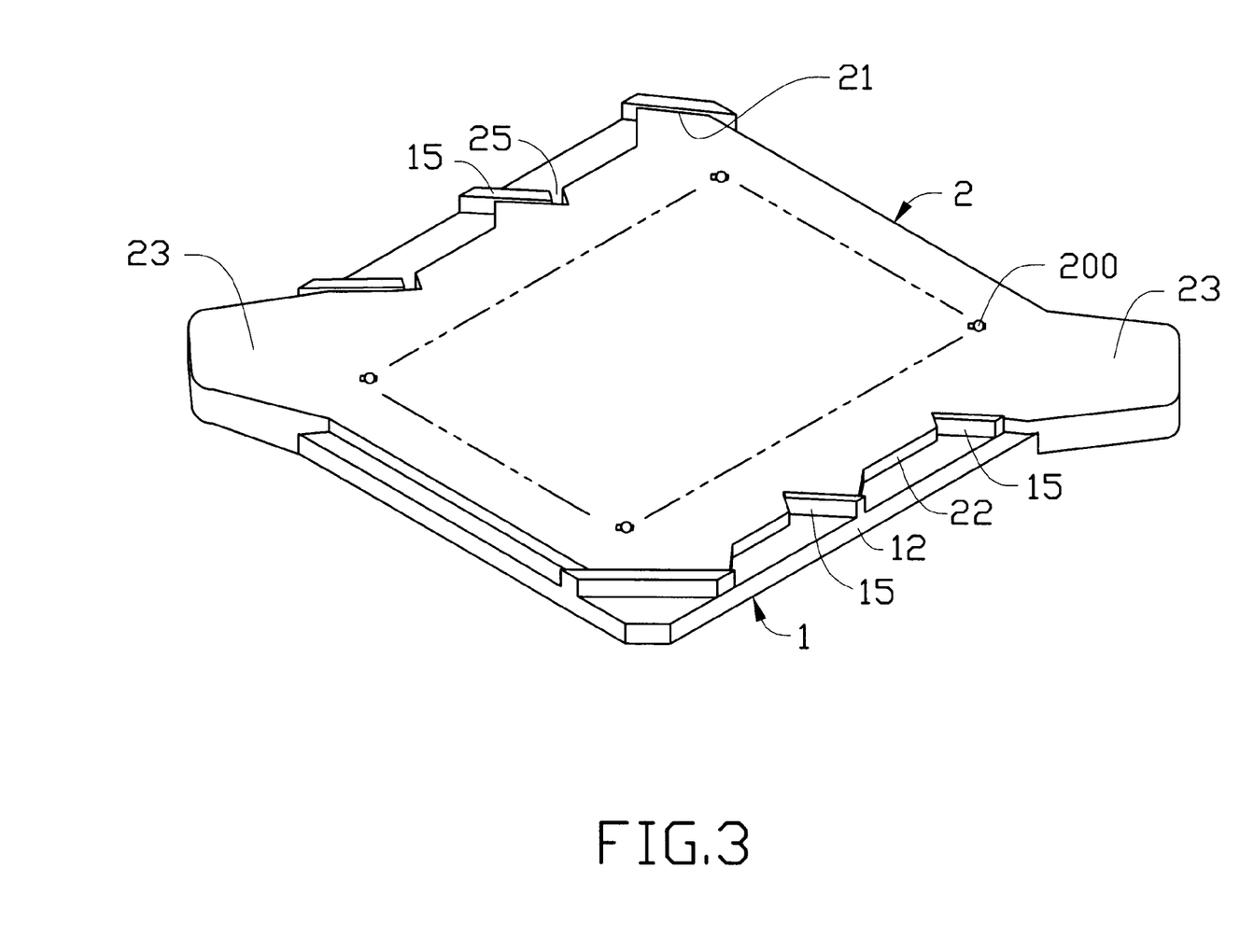
FIG. 3 is an assembled view of FIG. 2 substantially taken from a bottom side thereof.

Referring to FIGS. 1 and 2, a low profile socket in accordance with a first embodiment of the present invention comprises an insulative rectangular cover 1 and an insulative rectangular base 2 adapted to be movably engaged with each other. The base 2 defines a plurality of passageways 200 for receiving contacts (not shown) therein. The cover 1 defines a plurality of conic holes 100 for receiving and guiding pins of a CPU module to be originally inserted into the contacts with substantially zero insertion force and then driven by the cover 1 to firmly retained in the contacts. The detailed of the contacts may be referred to the copending U.S. patent application Ser. No. 09/146,998 which is assigned to the same assignee of the present invention. The cover 1 has an upper surface 1A and a lower surface 1B. A closure block 11 extends from four edges of the upper surface 1A thereby thickening the edges of the cover 1. The cover 1 has opposite chamfered abutment corners 14 between which a virtual diagonal line 16 is defined. Two guiding protrusions 15 extend from each of opposite sides of the cover 1 and each guiding protrusion 15 defines a blind hole 150 which exposes to the upper surface 1A of the cover 1. Two retaining protrusions 15' extend downward from near the other pair of corners and spaced from each other with a predetermined distance. Also referring to FIG. 3, the base 2 has a pair of opposite chamfered corners 21 movably retained between the two retaining protrusions 15' of the cover 1 when the cover 1 is engaged with the base 2. The base 2 has opposite sides 22 each of which defines two triangular cutouts 25 for movably receiving the guiding protrusions 15 of the cover 1. A tab 251 extending from one side of each triangular cutout 25 is movably received in the blind hole 150 of each guiding protrusion 15 of the cover 1. The movable distance of each tab 251 within the blind hole 150 is the movable distance of the cover 1 with respect to the base 2. Two wings 23 extend from opposite corners of the base 2 and a virtual diagonal line 26 is defined between the wings 23. A substantially U-shaped block 24 extends upward from an end portion of each wing 23 so that central walls 27 of the two blocks 24 are substantially in alignment with the diagonal line 26.

Figure 4:
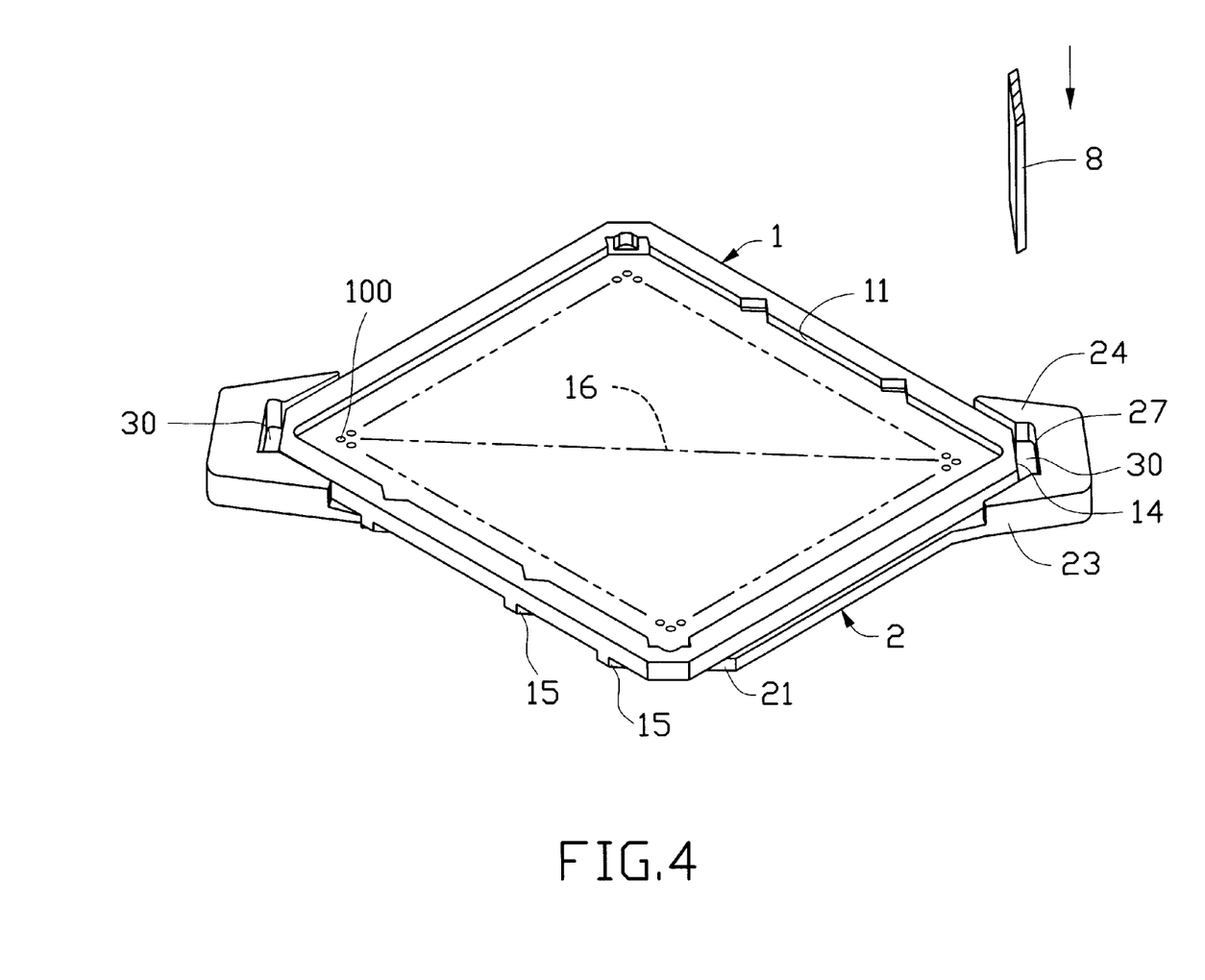
FIG. 4 is an assembled view of FIG. 1 substantially taken from a top side thereof.

Referring to FIG. 4, when the cover 1 is engaged with the base 2, an operational cavity 30 is defined between the chamfered abutment corner 14 and the U-shaped block 24, wherein the central wall 27 of the block 24 faces the chamfered corner 14. With the operational cavity 30, a head portion of an external screwdriver 8 may be positioned therein to drive the cover 1 from the chamfered corner 14. When the screwdriver 8 drives the cover 1, it is rotated along a vertical axis thereof so that one side thereof abuts against the chamfered corner 14 while an opposite side thereof abuts against the central wall 27 of the block 24. Since the chamfered corner 14 is thickened by the closure wall 11, the screwdriver 8 will not slip away thereover thereby guaranteeing proper operation of the screwdriver 8. The cover 1 will not damage or warp during frequent movement because the reinforced closure wall 11 can resist the impact from the screwdriver 8. Understandably, the cavity 30 is dimensioned to be of a range for allowing insertion of the head portion of the screwdriver 8 at a first position and rotation of the head portion of the screwdriver 8 at a second position.

Figure 5:
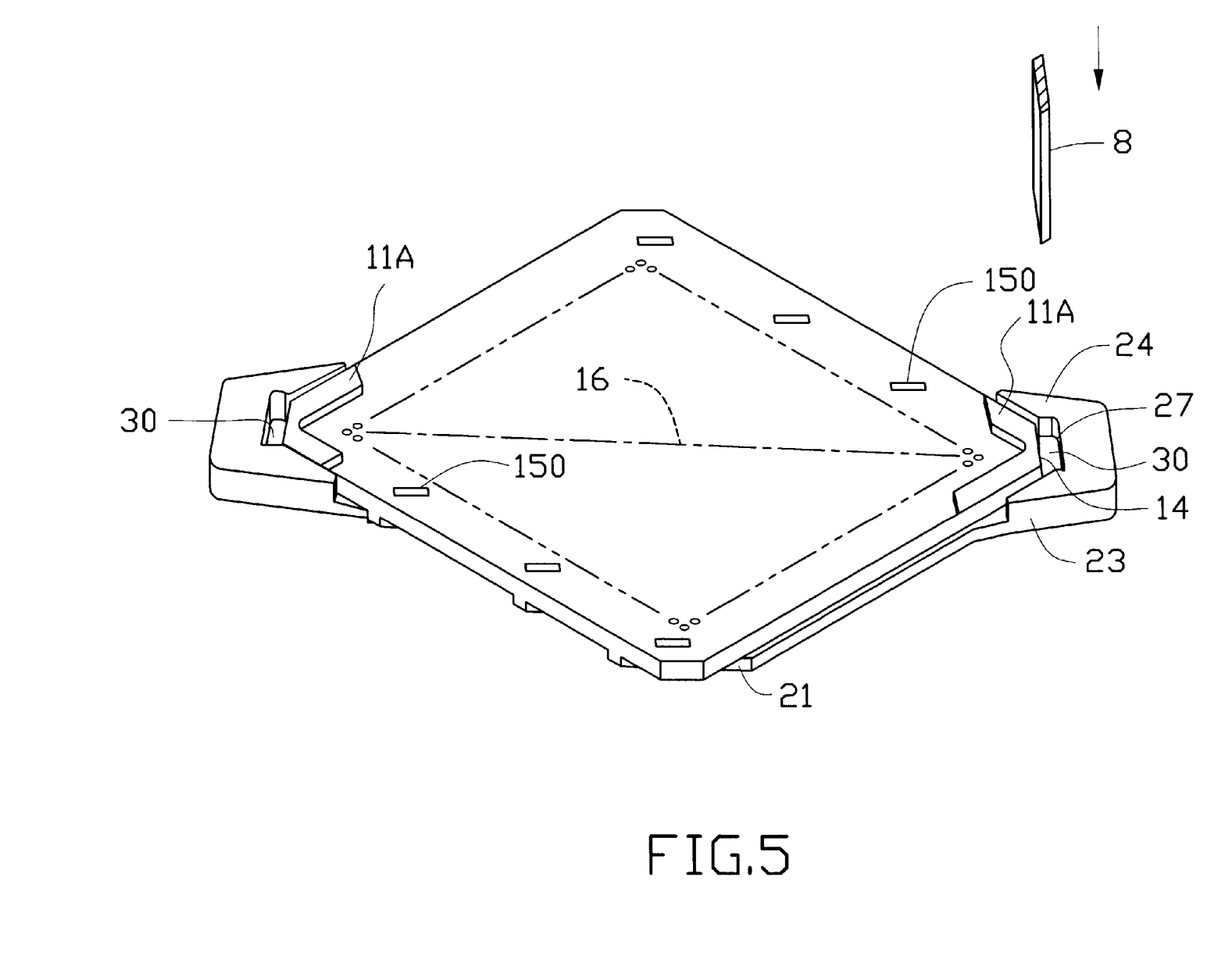
FIG. 5 is a second embodiment of a low profile socket in accordance with the present invention.

FIG. 5 illustrates a second embodiment of the present invention which is quite similar to that of the first embodiment except that the reinforced closure wall 11 is replaced by a pair of V-shaped walls 11A extending upward from opposite corners of the upper surface 1A of the cover 1. In this embodiment, the chamfered corner 14 is not changed so is the operational cavity 30, therefore the operation thereof is the same as that in the first embodiment.

Figure 6:
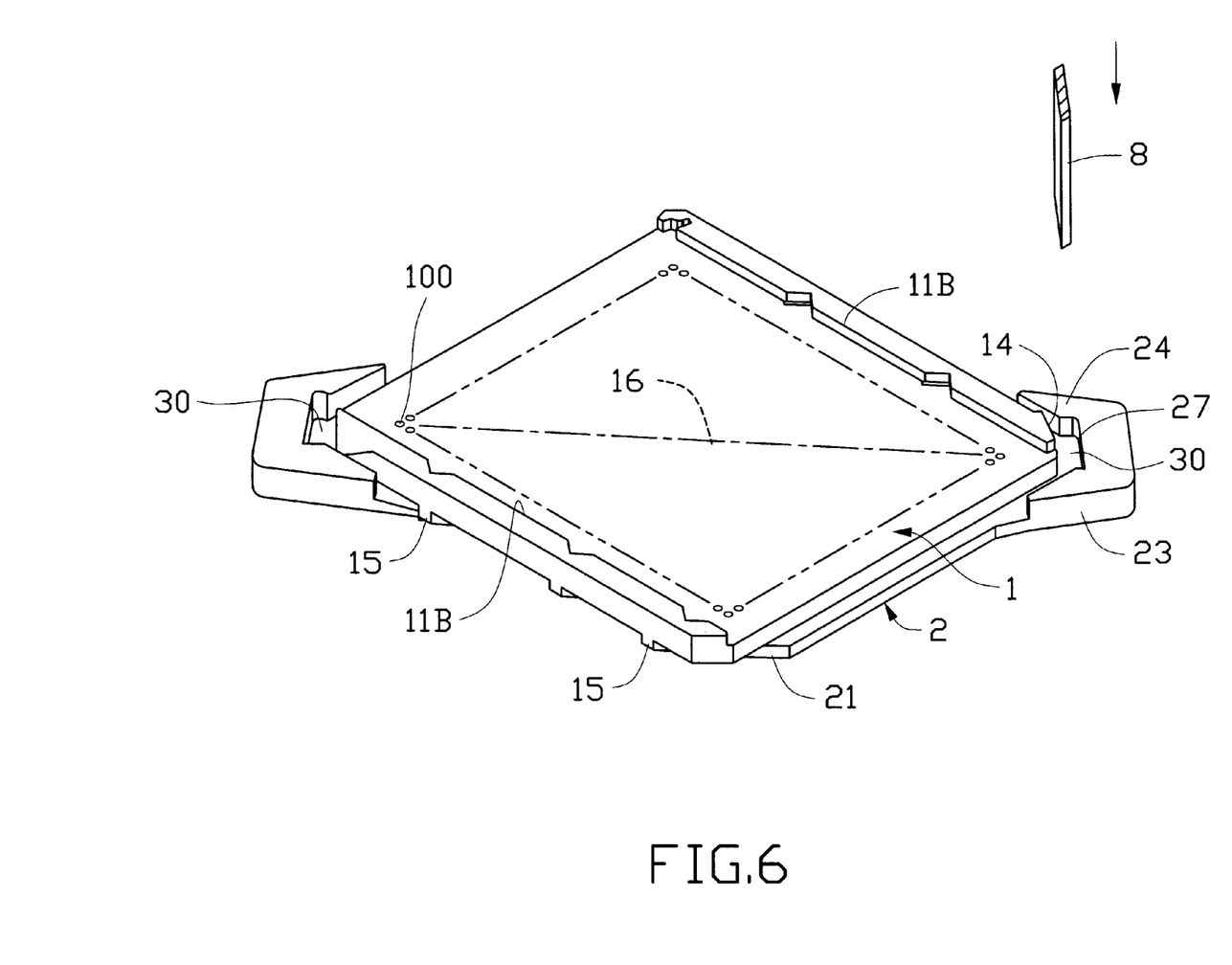
FIG. 6 is a third embodiment of a low profile socket in accordance with the present invention.

FIG. 6 illustrates a third embodiment of the present invention which is quite similar to that of the first embodiment except that the reinforced closure wall 11 is replaced by a pair of bars 11B extending upward from opposite sides of the upper surface 1A of the cover 1. Each bar 11B horizontally extends from one corner to an adjacent corner so that the chamfered corner 14 is not changed so is the operational cavity 30, therefore the operation thereof is the same as that in the first embodiment.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. An electrical socket comprising:
    a rectangular base having two wings extending from a first pair of opposite corners thereof thereby defining a virtual diagonal line between the wings;
    a block extending upward from each wing of the base;
    a rectangular cover movably engaged with the base and movable along the diagonal line of the base;
    a pair of opposite chamfered corners formed on the cover;
    a closure block extending upward from four edges of the cover thereby thickening the chamfered corners; and
    an operational cavity defined between the thickened chamfered corner of the cover and the block of the base for position of an external screwdriver;
    whereby when the external screwdriver is rotated along a vertical axis thereof, the thickened chamfered corner of the cover and the block of the base simultaneously receive force from the screwdriver thereby causing the cover to move with respect to the base.

2. The electrical socket as claimed in claim 1, wherein the block of the base is substantially U-shaped so that a central wall thereof faces the chamfered corner of the cover.

3. The electrical socket as claimed in claim 2, wherein the base has a second pair of opposite corners formed with chamfer faces for movable retention between two retaining protrusions extending downward from the cover.

4. An electrical socket comprising:
    a rectangular base having two wings extending from a first pair of opposite corners thereof thereby defining a virtual diagonal line between the wings;
    a block extending upward from each wing of the base;
    a rectangular cover movably engaged with the base and movable along the diagonal line of the base;
    a pair of opposite chamfered corners formed on the cover;
    two V-shaped blocks extending upward from edges of opposite corners of the cover thereby thickening the chamfered corners; and
    an operational cavity defined between the thickened chamfered corner of the cover and the block of the base for position of an external screwdriver;
    whereby when the external screwdriver is rotated along a vertical axis thereof, the thickened chamfered corner of the cover and the block of the base simultaneously receive force from the screwdriver thereby causing the cover to move with respect to the base.

5. The electrical socket as claimed in claim 4, wherein the block of the base is substantially U-shaped so that a central wall thereof faces the chamfered corner of the cover.

6. The electrical socket as claimed in claim 5, wherein the base has a second pair of opposite corners formed with chamfer faces for movable retention between two retaining protrusions extending downward from the cover.

7. An electrical socket comprising:
    a rectangular base having two wings extending from a first pair of opposite corners thereof thereby defining a virtual diagonal line between the wings;
    a block extending upward from each wing of the base;
    a rectangular cover movably engaged with the base and movable along the diagonal line of the base;

a pair of opposite chamfered corners formed on the cover;

two bars extending upward from opposite edges of the cover and each bar horizontally extending between adjacent corners of the cover thereby thickening the chamfered corners; and an operational cavity defined between the thickened chamfered corner of the cover and the block of the base for position of an external screwdriver;

whereby when the external screwdriver is rotated along a vertical axis thereof, the thickened chamfered corner of the cover and the block of the base simultaneously receive force from the screwdriver thereby causing the cover to move with respect to the base.

8. The electrical socket as claimed in claim 7, wherein the block of the base is substantially U-shaped so that a central wall thereof faces the chamfered corner of the cover.

9. The electrical socket as claimed in claim 8, wherein the base has a second pair of opposite corners formed with chamfer faces for movable retention between two retaining protrusions extending downward from the cover.

10. An electrical socket comprising:

a base including a pair of blocks respectively positioned on a pair of corners along a diagonal direction, said pair of blocks being thicker than remaining portions of the base and including respectively central walls facing to each other;

a cover moveably engaged with the base and including a pair of opposite abutment corners along said diagonal direction; and an operation cavity defined between each abutment and the central. wall of the corresponding block, and dimensioned to allow insertion and rotation of an external tool therein.

11. The socket as claimed in claim 10, wherein a thickened portion is formed about the abutment corner.

12. The socket as claimed in claim 11, wherein said thickened portion can be a portion of a closure block, a V-shaped block, or a bar.

* * * * *